(12) United States Patent
Kimura et al.

(10) Patent No.: US 6,610,987 B2
(45) Date of Patent: Aug. 26, 2003

(54) APPARATUS AND METHOD OF ION BEAM PROCESSING

(75) Inventors: Yoshihiro Kimura, Hitachinaka (JP); Ko Hisamoto, Hitachiota (JP); Takaharu Sugiura, New York, NY (US); Yusuke Narita, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/081,179

(22) Filed: Feb. 25, 2002

(65) Prior Publication Data

US 2002/0175296 A1 Nov. 28, 2002

(30) Foreign Application Priority Data

May 23, 2001 (JP) ........................ 2001-153690

(51) Int. Cl.⁷ .................. H01J 37/08; G21K 5/00; A61N 5/00; G21G 5/00
(52) U.S. Cl. ............... 250/492.21; 250/492.1; 250/492.2; 250/492.3; 250/398
(58) Field of Search ............ 250/492.1, 492.2, 250/492.21, 492.23, 492.3, 497.1, 498.1

(56) References Cited

U.S. PATENT DOCUMENTS

| 3,955,091 | A | * | 5/1976 | Robinson et al. ....... 250/423 R |
| 4,816,133 | A | * | 3/1989 | Barnett ................. 118/500 |
| RE33,193 | E | * | 4/1990 | Yamaguchi et al. ...... 250/309 |
| 5,601,654 | A | * | 2/1997 | Springer ............... 118/723 HC |
| 5,652,195 | A | * | 7/1997 | Horsten et al. ......... 427/152 |
| 5,750,987 | A | * | 5/1998 | Ichimura et al. ........ 250/251 |
| 5,811,820 | A | * | 9/1998 | Kirchner et al. ........ 118/723 FI |
| 5,825,035 | A | * | 10/1998 | Mizumura et al. ....... 250/423 R |
| 5,986,264 | A | * | 11/1999 | Grunewald ............. 250/310 |
| 6,051,113 | A | * | 4/2000 | Moslehi ................ 118/719 |
| 6,132,805 | A | * | 10/2000 | Moslehi ................ 118/720 |
| 6,184,625 | B1 | * | 2/2001 | Ogura et al. ........... 118/723 ME |
| 6,320,321 | B2 | * | 11/2001 | Ogura et al. ........... 118/723 MW |

FOREIGN PATENT DOCUMENTS

| JP | 54124879 A | * | 9/1979 | ........... C23C/13/00 |
| JP | 404206249 A | * | 7/1992 | ........... H01J/37/30 |
| JP | 5-128997 | | 5/1993 | |
| JP | 2000-260160 | | 9/2000 | |
| JP | 2002-75968 | | 3/2002 | |
| JP | 2002075968 A | * | 3/2002 | ....... H01L/21/3065 |

* cited by examiner

Primary Examiner—John R. Lee
Assistant Examiner—Bernard E. Souw
(74) Attorney, Agent, or Firm—Mattingly, Stanger & Malur, P.C.

(57) ABSTRACT

In order to suppress quick potential change on the surface of a process target when the shutter plate is opened and closed, when an ion beam IB from the ion source 10 is irradiated on a substrate 38 and the ion beam IB is neutralized by using neutralizing electrons e⁻ generated by a microwave neutralizer 14, the shutter plate 62 shields the substrate 38 before and after the milling processing of the substrate 38, and the voltage of a power supply 34 is lowered when the shutter plate 62 is opened and closed so as to limit the amount of ion beam IB irradiation, thereby suppressing charge-up on the surface of the substrate 38.

9 Claims, 3 Drawing Sheets

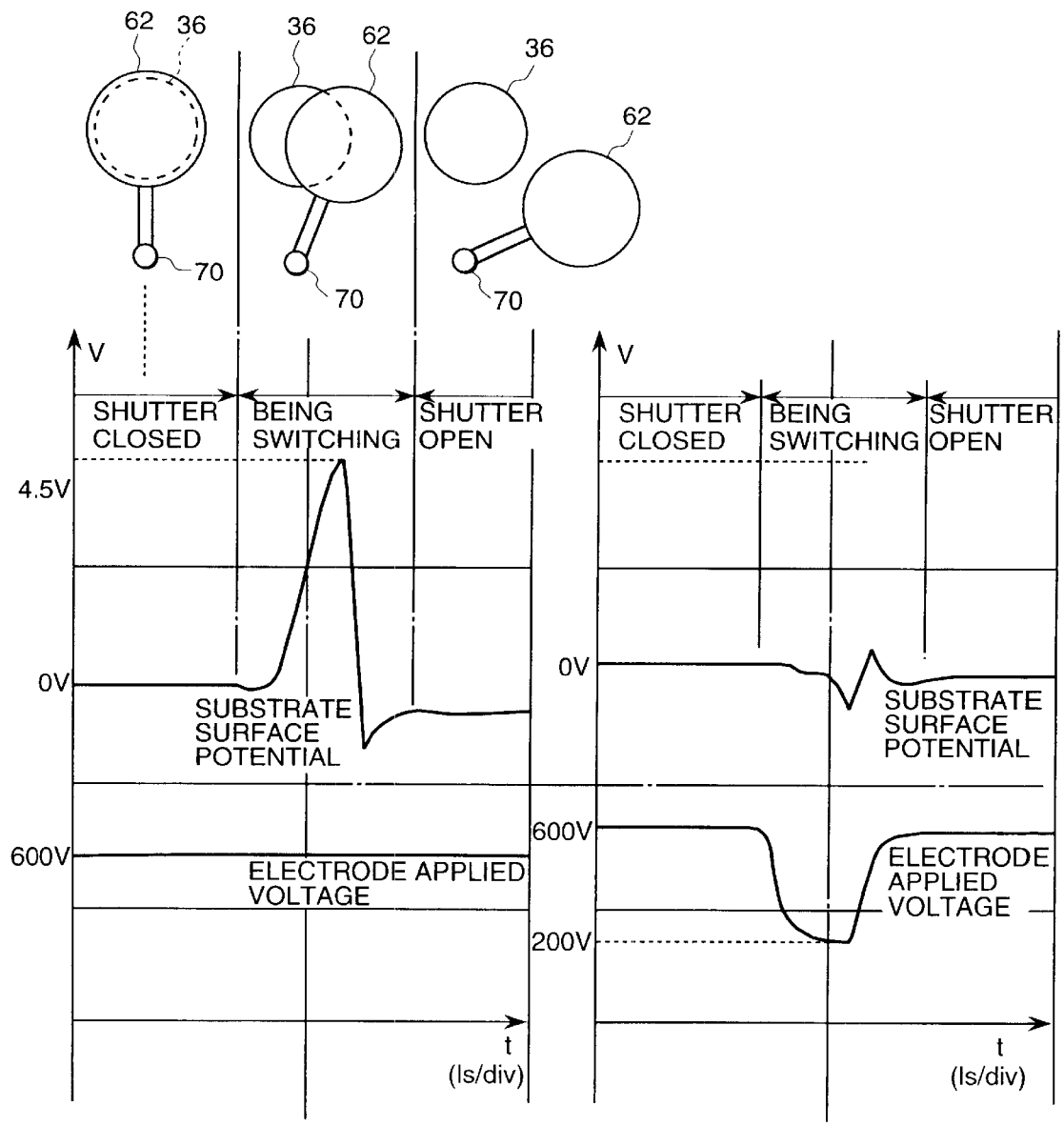

APPARATUS AND METHOD OF ION BEAM PROCESSING

BACKGROUND OF THE INVENTION

The present invention relates to an apparatus and method of ion beam processing, and more specifically to an apparatus and method of ion beam processing suitable for processing silicon substrates by ion beam milling and ion beam sputtering.

As an ion beam processing apparatus, there is a well-known ion beam processing apparatus comprising an ion source for generating plasma by introducing Ar gas, etc., a processing chamber for holding a substrate in a vacuum atmosphere and processing the substrate with an ion beam, an ion source power supply for extracting the plasma generated by the ion source as an ion beam into an ion beam guide tube which connects the ion source with the processing chamber and then irradiating the ion beam on the substrate in the processing chamber, and a vacuum exhaust system for vacuum pumping the processing chamber.

Conventionally, this kind of ion beam processing apparatus provides a shutter plate being disposed so as to be freely opened and closed, between a substrate holder for holding a substrate and an ion source power supply, to prevent the ion beam extracted by the ion source power supply from being irradiated directly on the substrate before and after the milling process.

Further, when a substrate is processed by milling with the extracted ion beam, the surface of the substrate is positively charged due to the positive charge of the ion beam. For this reason, if the substrate surface remains charged in a positive state, electrostatic discharge damage (ESD) to elements is caused by charge-up on the substrate surface. To prevent this electrostatic discharge damage to the elements, an apparatus, called a neutralizer, is provided for supplying electrons between the ion source and the shutter plate.

As well-known neutralizers, there are a filament-type neutralizer which applies voltage to a filament to make it glow thereby releasing thermoelectrons, and a microwave neutralizer which guides a microwave between the ion source power supply and the shutter plate to generate plasma thereby supplying electrons from the generated plasma.

Incidentally, as the capacity of computer hard disks has become large lately, read/write magnetic heads have rapidly been microminiaturized and thin-film oriented. Elements used for magnetic heads are being shifted from MR (Magneto Resistive) heads to GMR (Giant Magneto Resistive) heads. In the future, it can be expected that the demand for larger capacity will shift the trend to more highly sensitive TMR (Tunnel Magneto Resistive) heads.

In a conventional ion beam processing apparatus, a quantitative balance between positively charged ion beams and negatively charged neutralizing electrons is not considered to be important. For this reason, as elements become microminiaturized and thin-film oriented, a problem of electrostatic discharge damage to the elements due to charge-up on the substrate surface becomes a more serious problem to be solved. Specifically, when the shutter plate is opened and closed, neutralizing electrons are drawn to the shutter plate as a result of the opening and closing action of the shutter plate. By doing so, the potential of the substrate surface becomes positively charged due to a lack of neutralization, thereby easily damaging the elements, which makes it difficult to process miniaturized, thin-film elements.

Therefore, this applicant has applied for a patent of a method for applying voltage to a shutter plate when the shutter plate is opened and closed so as to solve the problem of insufficient neutralization when the shutter plate is opened and closed (Patent Application No. 2000-260160). In this case, to solve the problem of insufficient neutralization when the shutter plate is opened and closed, a power supply is required to apply voltage to the shutter plate. Such an apparatus having the shutter plate is shown in Japanese Patent Application Laid-open No. 5-128997, for example.

SUMMARY OF THE INVENTION

The purpose of the present invention is to provide an apparatus and method of ion beam processing which can suppress rapid potential change on the surface of a process target when the shutter plate is opened and closed.

To solve said problem, the present invention constitutes an ion beam processing apparatus comprising an ion source for generating plasma by introducing gas; a processing chamber for processing a process target with an ion beam in a vacuum atmosphere; an ion source power supply for extracting the plasma generated by said ion source as an ion beam into an ion beam guide tube which connects said ion source with said processing chamber and then irradiating the ion beam on said process target in said processing chamber; a neutralizer for neutralizing said ion beam; a shutter plate, being disposed so as to be freely opened and closed at a location closer to said ion source side than said process target, for shielding said process target from said ion beam when it is closed; and ion beam control means for controlling the amount of ion beam extracted from said ion source power supply when said shutter plate is opened and closed.

When constituting said ion beam processing apparatus, instead of ion beam control means, it is possible to provide current quantity control means for controlling the quantity of ion beam current when the shutter plate is opened and closed, or voltage control means for controlling voltage of the ion source power supply when the shutter plate is opened and closed. In this case, it is preferable that the ion beam control means controls the amount of ion beam to decrease when the shutter plate is opened and closed, and that the current quantity control means controls the quantity of ion beam current to decrease when the shutter plate is opened and closed, and also that voltage control means controls the voltage to be low when the shutter plate is opened and closed.

Further, instead of using ion beam control means, current quantity control means, or voltage control means, it is also possible to control neutralization quantity of the neutralizer, for example, to control the neutralization ability to increase neutralization when the shutter plate is opened and closed. Furthermore, in addition to increasing the neutralization ability when the shutter plate is opened and closed, it is possible to simultaneously control the amount of ion beam to decrease or to control the ion source power supply voltage to become lower.

When constituting each of said ion beam processing apparatus, the following factors can be added.

(1) Said neutralizer is a filament-type neutralizer which emits thermoelectrons from the filament connected to the power supply and neutralizes said ion beam.

(2) Said neutralizer is a microwave neutralizer which generates plasma by irradiating a microwave into a magnetic field and neutralizes said ion beam by electrons contained in the generated plasma.

Further, the present invention can process a process target with an ion beam and-also, the following processing methods are available when said ion beam is neutralized.

(1) A method for shielding said process target with a shutter plate before and after the processing of said process target so as to block said ion beam from being irradiated on said process target; limiting the amount of said ion beam irradiated on said process target while retracting said shutter plate from the said ion beam irradiation area to the outside thereof or moving said shutter plate from the outside of the said ion beam irradiation area to the inside thereof in the process of starting or finishing processing said process target; and releasing the limitation to said ion beam and irradiating the ion beam on said process target during the processing after said shutter plate has been retracted outside the said ion beam irradiation area.

(2) A method for shielding said process target with a shutter plate before and after the processing of said process target so as to block said ion beam from being irradiated on said process target; limiting the amount of said ion beam irradiated on said process target in the process of moving said shutter plate inside and outside the said ion beam irradiation area; and then releasing the limitation to said ion beam and irradiating the ion beam on said process target during the processing after said shutter plate has been retracted outside the said ion beam irradiation area.

(3) A method for shielding said process target with a shutter plate before and after the processing of said process target so as to block said ion beam from being irradiated on said process target; increasing the ability to neutralize said ion beam in the process of moving said shutter plate inside and outside the said ion beam irradiation area; and irradiating said ion beam on said process target during the processing after said shutter plate has been retracted outside the said ion beam irradiation area while restoring said neutralization ability to the level used for the processing.

Because said means control the amount of ion beam, quantity of ion beam current, ion source power supply voltage, or neutralization quantity when the shutter plate is opened and closed, even if a quantitative balance between positively charged ion beams and negatively charged neutralizing electrons is lost when the shutter plate is opened and closed, it is possible to suppress quick potential change (charge-up) on the surface of the process target when the shutter plate is opened and closed, thereby suppressing the electrostatic discharge damage to the process target (element), thus making it possible to process a microminiaturized, thin-film element.

Further, because said means limit the amount of said ion beam irradiated on said process target while retracting said shutter plate from the said ion beam irradiation area to the outside thereof or moving said shutter plate from the outside of the said ion beam irradiation area to the inside thereof in the process of starting or finishing processing said process target; limit the amount of said ion beam irradiated on said process target in the process of moving said shutter plate inside and outside the said ion beam irradiation area; or increase the ability to neutralize said ion beam; even if a quantitative balance between positively charged ion beams and negatively charged neutralizing electrons is lost when the shutter plate is opened and closed, it is possible to suppress quick potential change (charge-up) on the surface of the process target when the shutter plate is opened and closed, thereby suppressing the electrostatic discharge damage to the process target (element), thus making it possible to process a microminiaturized, thin-film element.

BRIEF DESCRIPTION OF THE DRAWINGS

FIGS. 3(*a*) and 3(*b*) are time charts that explain the action of the apparatus shown in FIG. 1.

DETAILED DESCRIPTION OF THE PREFERRED EMBODIMENTS

Figure 1:
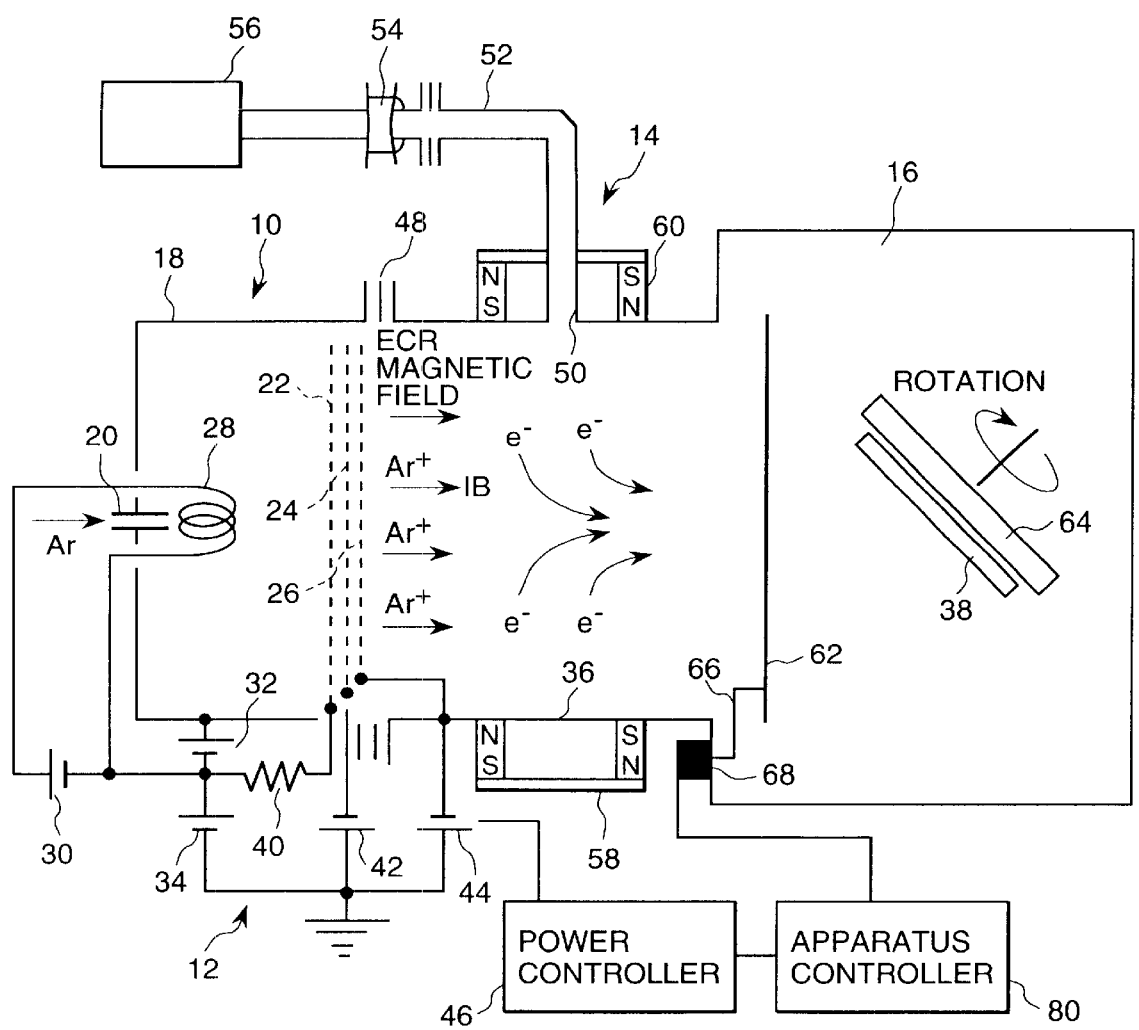
FIG. 1 is a schematic diagram of an ion beam processing apparatus showing an embodiment of the present invention.

An embodiment of the present invention will be described hereunder with reference to the drawings. FIG. 1 is a schematic diagram of an ion beam processing apparatus which is an embodiment of the present invention. In FIG. 1, an ion beam processing apparatus consists of an ion source 10, an ion source power supply 12, a microwave neutralizer 14, and a processing chamber 16.

The ion source 10 has an almost cylindrical ion source chamber 18, one end of which is closed and the other end is open. A gas introducing inlet 20 is formed in the closed surface and an acceleration electrode 22, a deceleration electrode 24, an a third electrode 26 are disposed on the open end side. Further, a filament 28 is accommodated in the ion source chamber 18 and both ends of the filament 28 are drawn outside the ion source chamber 18 to connect with a power supply 30. The ion source chamber 18 is connected with a voltage-adjustable power supply 34 via a power supply 32. Ar gas or the like is introduced into the ion source chamber 18 through the gas introducing inlet 20. The introduced Ar gas is made into plasma by thermoelectrons generated from the filament 28.

That is, the ion source 10 is constituted so as to introduce Ar gas through the gas introducing inlet 20 and generate plasma. The generated plasma is extracted into an ion beam guide tube 36 as an ion beam (positively charged Ar beam) IB by the ion source power supply 12 and then the ion beam is irradiated on a substrate 38 in the processing chamber 16.

Among the acceleration electrode 22, deceleration electrode 24 and third electrode 26 which constitute the ion source power supply 12, the acceleration electrode 22 is connected to the positive terminal of the power supply 34 via a resistor 40, the deceleration electrode 24 is connected to the negative terminal of the power supply 42, and the third electrode 26 is connected to the negative terminal of the power supply 44 together with the ion beam guide tube 36. The power supply 44 is provided as a neutralizer power supply so as to apply negative voltage to the third electrode 26 and the ion beam guide tube 36. Further, power supplies 30, 34, 42, 44 are connected to a power controller 46 respectively so that the output voltage can be controlled by a command sent from the power controller 46.

The ion beam guide tube 36 is an almost cylindrical ion beam guide tube which connects the ion source 10 with the processing chamber 16. One end of the ion beam guide tube 36 is coupled with the ion source chamber 18 via an insulating member 48, and the other end of the ion beam guide tube 36 is connected to an end of the processing chamber 46. Further, a microwave introducing inlet 50 is formed on the inner circumference side of the ion beam guide tube 36 and a microwave neutralizer 14 is coupled on the outer circumference surface.

The-microwave neutralizer 14 consists of a wave guide tube 52, a quartz window 54, a microwave oscillator 56, a ring 58, and permanent magnets 60, and the ring 58 is fixed to the outer circumference surface of the ion beam guide tube 36. The ring 58 is disposed along the outer circumference surface of the ion beam guide tube 36 and a plurality of two pairs of permanent magnets 60 are disposed on the ring 58 in a ring shape. The permanent magnets 60 form the ECR magnetic field on the inner circumference side of the ring 58. Further, the wave guide tube 52 is connected to the microwave introducing inlet 50, the quartz window 54 is inserted halfway into the wave guide tube 52, and the microwave oscillator 56 is connected to the end portion of the wave guide tube 52. The microwave oscillator 56 oscillates a 2.45 GHz microwave, propagates the microwave in the wave guide tube 52 through the quartz window 54, and irradiates the microwave into the ion beam guide tube 36 through the microwave introducing inlet 50. When a microwave is irradiated into the ECR magnetic field, plasma is generated due to the ECR magnetic field and the microwave. Then, by applying a negative potential to the ion beam guide tube 36, positive ions contained in the plasma are extracted to the ion beam guide tube 36 side, causing the plasma to have excessive electrons, thereby the electrons e⁻ supplied from the plasma neutralizing the ion beam IB. That is, the electrons e⁻ neutralize the ion beam IB in the process of being transmitted through the ion beam guide tube 36 and also neutralize positive charges applied on the surface of the substrate 38.

Moreover, the substrate 38 and the shutter plate 62 are accommodated in the processing chamber 16 which is connected to the vacuum exhaust system (not shown) and maintained in a vacuum atmosphere. The substrate 36 is, for example, a disk-shaped silicon substrate which is rotatably held by a disk-shaped substrate holding apparatus 64. The substrate 38 is held tilting at a given angle with respect to the direction of the ion beam IB transmission by the substrate holding apparatus 64.

The shutter plate 62 is disposed so as to be freely opened and closed in the area between the microwave neutralizer 14 and the substrate holding apparatus 64 in order to prevent the ion beam IB irradiated from the ion source 10 and the neutralizing electrons e⁻ emitted from the microwave neutralizer 14 from being irradiated on the substrate 38 at the startup of the ion source and the neutralizer power supply before and after the milling process. The shutter plate 62 is formed as a disk-shaped shielding plate which shields the ion beam IB and the neutralizing electrons e⁻ when the shutter plate is closed (when the end portion side of the ion beam guide tube 36 is closed) to prevent those from being irradiated on the substrate 38. The end portion of the shielding plate 62 is connected to the shutter drive controller 68 via an arm 66 and is retracted from the ion beam irradiation area to the outside thereof according to the drive of the shutter drive controller 68 except when the substrate 38 is processed with the ion beam.

That is, the shutter drive controller 68 controls the shutter plate 62 to be retracted from the ion beam irradiation area to the outside thereof at the startup of the substrate 38 processing and to be moved from the outside of the ion beam irradiation area to the inside thereof at the end of the substrate 38 processing.

Figure 2:
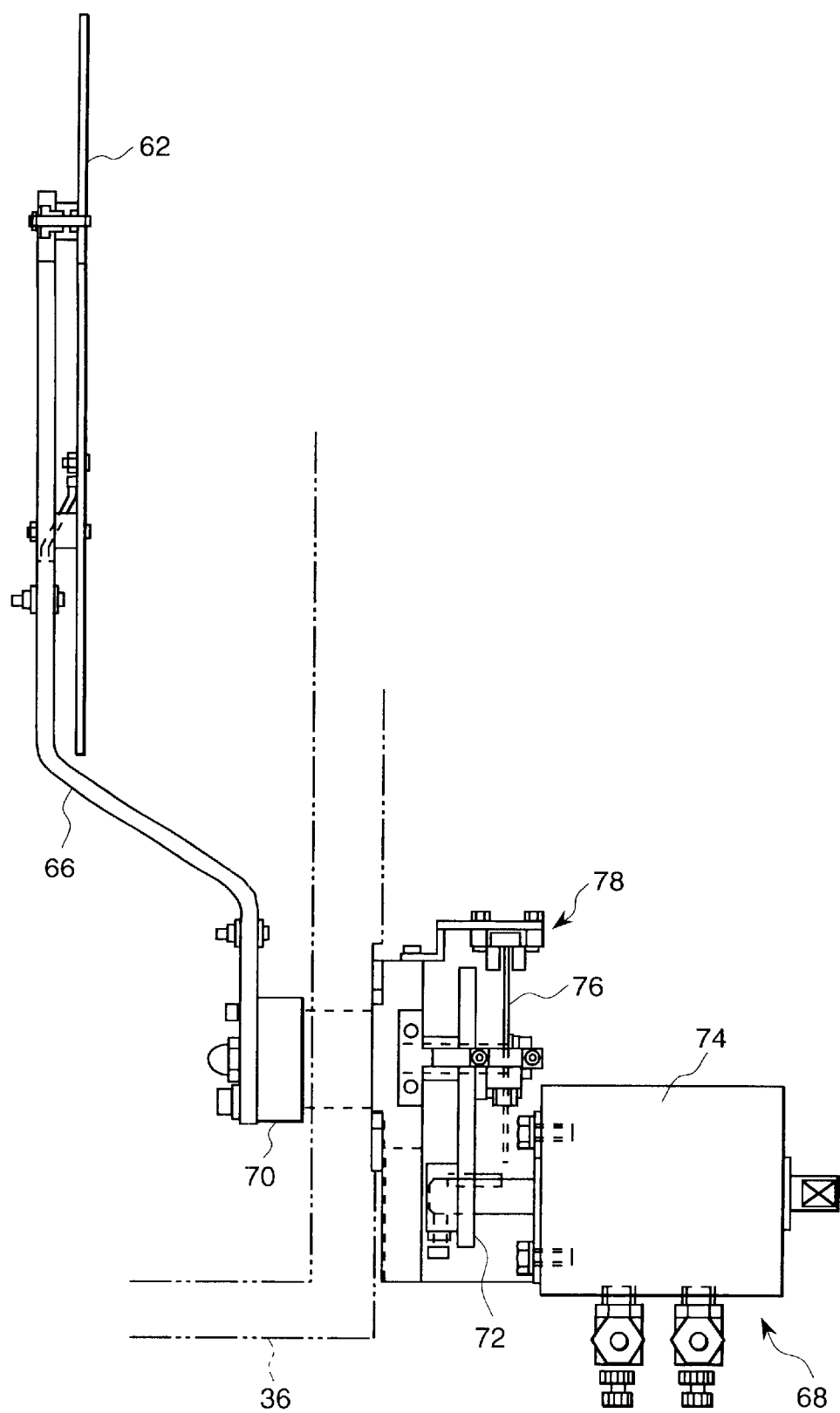
FIG. 2 is an explanatory drawing for a shutter plate and a shutter drive controller.

As shown in FIG. 2, the shutter drive controller 68 consists of a motor 74 which drives a shaft 70 that holds the end portion of the arm 66 via connecting member 72 so as to be able to swing, a shielding plate 76, and an optical sensor 78. The main body of the controller is fixed to the wall surface of the processing chamber 16, and the shutter drive controller 68 is connected to the apparatus controller 80 (as shown in FIG. 1). The optical sensor 78 has a light-receiving device and a light-emitting device, and the shielding plate 76 is rotatably disposed between the light-receiving device and the light-emitting device. The shielding plate 76 is arranged such that it rotates together with the shaft 70 and shields an optical transmission line connecting between the light-receiving device and the light-emitting device when the shutter plate 62 is located at its closing position, and moves away from the optical transmission line connecting between the light-receiving device and the light-emitting device when the shutter plate 62 has moved from its closing position to its opening position.

Further, output signals sent from the optical sensor 78 are transferred to the apparatus controller 80 together with the position information of the shielding plate 76 and the shaft 70. An apparatus controller 80 is composed, for example, of a microcomputer having a CPU, or the like. And based on the command of processing the substrate 38, the apparatus controller 80 issues a drive command to the shutter drive controller 68 to open and close the shutter plate 62. Furthermore, the apparatus controller 80 issues a command to the power controller 46 to control power supply voltage according to the opening and closing action timing of the shutter plate 62.

Now, the action of the ion beam processing apparatus in this embodiment will be described with reference to FIGS 1–3. First, before the milling process starts, the shutter plate 62 is located at its closing position according to a command from the apparatus controller 80, thereby shielding the ion beam and the neutralizing electrons e⁻ to prevent those from being irradiated on the sub 38.

Next, when the command to start processing the substrate 38 by milling is issued, the shutter plate 62 is simultaneously opened and retracted from the ion beam irradiation area to the outside thereof. And, during the milling process after the shutter plate 62 has been retracted to the outside of the ion beam irradiation area (during the processing), the ion beam IB from the ion source 10 as well as the neutralizing electrons e⁻ are irradiated on the substrate 38. Thus, the substrate 38 is processed by milling with the ion beam-IB, and the positive charges applied on the substrate 38 surface are also neutralized by the neutralizing electrons e⁻. Consequently, a microminiaturized, thin-film element is processed on the surface of the substrate 38.

After the substrate 38 has been processed by milling, the shutter plate 62 is closed again and moved from the outside of the ion beam irradiation area to the inside thereof.

Incidentally, when the shutter plate 62 opens and closes, a quantitative balance between the ion beam IB and the neutralizing electrons e⁻ is lost, causing the neutralizing electrons e⁻ to flow into the shutter plate 62 according to the timing of the opening and closing action of the shutter plate 6. If the amount of ion beam IB irradiation remains constant, neutralization of the potential on the substrate 38 surface becomes insufficient. For example, as shown in FIG. 3(a), when the shutter plate 62 starts to open, a portion of neutralizing electrons e⁻ which are supplied from the microwave neutralizer 14 and being carried halfway in the ion beam IB guide tube flow into the shutter plate 62, causing a lack of neutralizing electrons e⁻ on the substrate 38 surface, thereby causing the substrate surface to become positively charged in the pulse form. If this state continues, the electrification will cause electrostatic discharge damage to the substrate 38 surface.

Therefore, in this embodiment, in the process of opening and closing the shutter plate 62, to limit the amount of ion beam IB irradiation, for example, the power supply voltage of a power supply 34 is changed stepwise from 600 V to 200 V so as to control the amount of the ion beam IB to decrease. When the power supply voltage of the power supply 34 is lowered, the quantity of ion beam current is controlled to decrease, and as a result of controlling the voltage to decrease, the quantity of ion beam current is lowered, thus causing the amount of ion beam IB irradiation to decrease. By doing so, as shown in FIG. 3(b), it is possible to suppress insufficient neutralization of the potential of the substrate 38 surface. That is, the charge-up on the surface of the substrate 38 can be suppressed, and even when the substrate 38 is composed of microminiaturized, thin-film elements, it is possible to highly accurately process the substrate 38 by milling. In this case, the power supply 34 and the power controller 46 are composed of ion beam control means, current quantity control means or voltage control means.

Further, instead of the power supply voltage of the power supply 34, it is possible to change power supply voltage of power supplies 30, 42 so as to lower the amount of ion beam IB irradiation. It is also possible to control the neutralization ability to increase in the state where the amount of ion beam IB irradiation is constant when the shutter plate 62 is opened and closed. Furthermore, it is also possible to carry out controls to limit the amount of ion beam IB irradiation and increase the neutralization ability of the neutralizing electrons $e^-$.

Moreover, this embodiment described above uses a microwave neutralizer 14 as a neutralizer, while it is also possible to use a filament-type neutralizer which emits thermoelectrons from a filament connected to a power supply and neutralizes the ion beam.

As described above, according to the present invention, even if a quantitative balance between positively charged ion beams and negatively charged neutralizing electrons is lost when the shutter plate is opened and closed, it is possible to suppress quick potential change on the surface of the process target when the shutter plate is opened and closed, thereby suppressing the electrostatic discharge damage to the process target, thus making it possible to process a microminiaturized, thin-film element.

What is claimed is:

1. An ion beam processing apparatus comprising
an ion source for generating plasma by introducing gas,
a processing chamber for processing a process target with an ion beam in a vacuum atmosphere,
an ion extraction voltage supply for extracting the plasma generated by slid ion source as an ion beam into an ion beam guide tube which connects said ion source with said processing chamber and then irradiating the ion beam on said process target in said processing chamber,
a neutralizer for neutralizing said ion beam,
a shutter plate, being disposed so as to be freely opened and closed at a location closer to said ion source side than said process target, for shielding said process target from said ion beam when it is closed, and
ion beam control means for controlling the amount of ion beam extracted from said ion extraction voltage supply to be decreased when said shutter plate is opened and closed.

2. An ion beam processing apparatus comprising
an ion source for generating plasma by introducing gas,
a processing chamber for processing a process target with an ion beam in a vacuuum atmosphere,
an ion extraction voltage supply for extracting the plasma generated by said ion source as an ion beam into an ion beam guide tube which connects said ion source with said processing chamber and, then irradiating the ion beam on said process target in said, processing chamber,
a neutralizer fort neutralizing said ion beam,
a shutter plate, being disposed so as to be freely opened and closed at a location closer to said ion source side than said process target, for shielding said process target from said ion beam when it is closed, and
current quantity control means for controlling the quantity of ion beam current to be decreased when said shutter plate is opened and closed.

3. An ion beam processing apparatus comprising
an ion source for generating plasma by introducing gas,
a processing chamber for processing a process target with an ion beam in a vacuuum atmosphere,
an ion extraction voltage supply for extracting the plasma generated by said ion source as an ion beam into an ion beam guide tube which connects said ion source with said processing chamber and then irradiating the ion beam on said process target in said processing chamber,
a neutralizer for neutralizing said ion beam,
a shutter plate, being disposed so as to be freely opened and closed at a location closer to said ion source side than said process target, for shielding said process target from said ion beam when it is closed, and
voltage control means for controlling voltage of said ion extraction voltage supply to be degraded when said shutter plate is opened and closed.

4. An ion beam processing apparatus comprising
an ion source for generating plasma by introducing gas,
a processing chamber for processing a process target with an ion beam in a vacuum atmosphere,
an ion extraction voltage supply for extracting the plasma generated by said ion source as an ion beam into an ion beam guide tube which connects said ion source with said processing chamber and then irradiating the ion beam on said process target in said processing chamber,
a neutralizer for neutralizing said ion beam, and
a shutter plate, being disposed so as to be freely opened and closed at a location closer to said ion source side than said process target, for shielding said process target from said ion beam when it is closed,
wherein said neutralizer controls the neutralization quantity to be increased when said shutter plate is opened and closed.

5. An ion beam processing apparatus according to claim 1, wherein said neutralizer is a hot-filament neutralizer which emits thermoelectrons from the filament connected to the power supply and neutralizes said ion beam.

6. An ion beam processing apparatus according claim 1, wherein said neutralizer is a microwave neutralizer which generates plasma by irradiating a microwave into a magnetic field and neutralizes said ion beam by electrons contained in the generated plasma.

7. An ion beam processing method for processing a process target with an ion beam and neutralizing said ion beam comprising:
shielding said process target with a shutter plate before and after the processing of said process target so as to block said ion beam from being irradiated on said process target;
limiting the amount of said ion beam irradiated on said process target while retracting said shutter plate from the said ion beam irradiation area to the outside thereof or moving said shutter plate from the outside of the said ion beam irradiation area to the inside thereof in the process of starting or finishing processing said process target;

releasing the limitation to said ion beam during the processing after said shutter plate has been retracted outside the said ion beam irradiation area; and irradiating the ion beam on said process target.

8. An ion beam processing method for processing a process target with an ion beam and neutralizing said ion beam comprising:

shielding said process target with a shutter plate before and after the processing of said process target so as to block said ion beam from being irradiated on said process target;

limiting the amount of said ion beam irradiated on said process target in the process of moving said shutter plate inside and outside the said ion beam irradiation area;

releasing the limitation to said ion beam during the processing after said shutter plate has been retracted outside the said ion beam irradiation area; and irradiating the ion beam on said process target.

9. An ion beam processing method for processing a process target with an ion beam and neutralizing said ion beam comprising:

shielding said process target with a shutter plate before and after the processing of said process target so as to block said ion beam from being irradiated on said process target;

increasing the neutralization ability to neutralize said ion beam in the process of moving said shutter plate inside and outside the said ion beam irradiation area; and irradiating said ion beam on said process target during the processing after said shutter plate has been retracted outside the said ion beam irradiation area while restoring said neutralization ability to the level used for the processing.

* * * * *